United States Patent
Pounds

[11] Patent Number: 5,872,478
[45] Date of Patent: Feb. 16, 1999

[54] SCR FIRING CIRCUIT FOR HIGH VOLTAGE CONTROL APPLICATIONS

[75] Inventor: David G. Pounds, Marion Center, Pa.

[73] Assignee: FMC Corporation, Chicago, Ill.

[21] Appl. No.: 743,995

[22] Filed: Nov. 4, 1996

[51] Int. Cl.[6] .............................................. H03K 17/725
[52] U.S. Cl. .......................... 327/453; 327/456; 327/461; 327/473
[58] Field of Search .................... 327/428, 439, 327/440, 443, 445, 447, 448, 450, 451, 453–456, 459–464, 468, 470–475

[56] References Cited

U.S. PATENT DOCUMENTS

| | | | |
|---|---|---|---|
| 3,693,027 | 9/1972 | Garaway | 327/451 |
| 4,048,520 | 9/1977 | Muskovac et al. | 327/460 |
| 4,489,372 | 12/1984 | Hatano et al. | 327/470 |
| 4,631,472 | 12/1986 | McCollum et al. | 327/460 |
| 4,675,543 | 6/1987 | Mitsuoka | 327/443 |
| 4,716,511 | 12/1987 | Masaki | 363/49 |
| 4,801,828 | 1/1989 | Ishikawa et al. | 327/464 |

OTHER PUBLICATIONS

Motorola Inc. *Motorola Optoelectronic Device Data*, 1983, pp. 3–65, 3–66.

*Primary Examiner*—Kenneth B. Wells
*Attorney, Agent, or Firm*—Rockey, Milnamow & Katz, Ltd.

[57] ABSTRACT

An SCR firing circuit is provided which includes a plurality of opto-couplers, diodes, a capacitor and an SCR, utilized to control the AC power applied to a load, such as a vibratory feeder. In various embodiments of the invention, one or more opto-couplers act as solid state switches and also isolate a control signal from the AC line voltage. The capacitor is charged from an AC power source through the diode during a half cycle of the AC line voltage, and remains charged until the SCR is triggered. In response to a control signal rendering the opto-couplers conductive, the capacitor is discharged through the opto-couplers to fire the SCR and provide AC power to the load. A back-to-back SCR firing circuit is also provided which fires a first SCR when a line voltage is positive and which fires a second SCR when the line voltage is negative, which may be utilized to adjust the frequency of the application of power to the load independently of the frequency of the AC power supply.

10 Claims, 3 Drawing Sheets

SCR FIRING CIRCUIT FOR HIGH VOLTAGE CONTROL APPLICATIONS

BACKGROUND OF THE INVENTION

1. Field of the Invention

This invention relates to firing circuits and more particularly to an SCR firing circuit that is useful in industrial control applications.

2. Description of Related Art

Firing circuits employing silicon controlled rectifiers or SCR's are used for powering equipment or other loads such as variable frequency or electromagnetic feeders. Typically, a microcontroller is employed for sending an appropriate signal to an SCR for powering the load. SCR's are turned on to their conducting state by applying a trigger pulse to their gate connection at some time during a half cycle of the power source line frequency. When triggered, the SCR continues to conduct until the current passing through it drops below its holding current value. By delaying the point in time of the trigger pulse, relative to the applied half cycle of power during which the device is triggered, the average power applied to a connected load may be changed for control purposes.

Various schemes have been devised and used to trigger SCR's but, other than directly connecting the gate to the anode, in which case the SCR becomes just a diode, there is always some delay from the zero cross point of the applied voltage wave form to the point where the SCR turns on, depending on the circuitry employed, such that it is not possible to obtain the maximum power available from the source. It may be difficult to fire the SCR close enough to the zero cross of the voltage waveform because of the time required to have sufficient power available to fire the SCR. It is therefore desirable to have an SCR firing circuit which fires closer to the zero cross point of the voltage waveform.

It is also desirable to electrically isolate the logic circuitry for control from the output power of the device, particularly if very high voltages are involved. Opto-couplers are used to isolate a low control voltage from a high power voltage. However, use of a single opto-coupler may not be strong enough to isolate higher power voltages. Other prior art devices have used a double stacked opto-coupler arrangement. However, such a double stacked arrangement may be limited to isolating the low control voltage from a supply of approximately 240 Volts. It is therefore desirable to provide an arrangement of opto-couplers that may isolate a low control voltage from rather high power voltages such as 380 to 600 Volts at 50 or 60 Hz. It is further desirable to provide a microcontrolled gate circuit capable of firing a wide variety of voltages.

Because of feed material characteristics on vibratory feeders or conveyors, it is often desirable to operate such equipment at low frequencies with higher strokes. When such equipment is powered by an electromagnet, it is cost effective and convenient to synthesize the low operating frequency from the 60 Hz or 50 Hz power source, by skipping an appropriate number of half cycles of the line frequency. For example, from a 60 Hz power line, frequencies that are even sub multiples of 120 pulses per second (7200 VPM) can be obtained. Dividing by 2 gives 60 Hz, dividing by 3 gives 40 Hz, by 4 gives 30 Hz, and so on. Since the actual power "on time" at any given frequency is limited to that of a half cycle at 60 Hz, it is desirable to capture as much of the available wave form as possible to maximize the output power. Therefore, it is desirable to minimize the amount of time delay from the zero voltage cross of the conducting wave form to the time the SCR turns on.

Moreover, feeders such as these may operate at power line voltages of up to 600 Volts AC. While SCR's are available with reverse voltage ratings of 1200 Volts or better, because of the requirement for controlling highly inductive, high voltage loads, generally pulse transformers are used for firing SCR's. However, pulse transformers may result in an undesirably long delay for the firing of the SCR and thus not enough output power may be obtained. In addition to the cost of pulse transformers, it may be more difficult to interface the control logic to the pulse transformer, and thus a more costly a solution. It is therefore desirable to have a firing circuit which has minimal delay in firing an SCR and which is also cost effective.

SUMMARY OF THE INVENTION

There is provided a firing circuit comprising a diode, a capacitor, and an SCR wherein the diode charges the capacitor for firing the SCR. There is also provided a back to back SCR firing circuit comprising a first and second diode, a first and second capacitor, and an SCR wherein the first diode charges the first capacitor for firing the SCR when a line voltage is positive and the second diode charges the second capacitor for firing the SCR when the line voltage is negative. There is further provided an isolator circuit comprising at least three opto-couplers arranged in series wherein the opto-couplers isolate a low control voltage from a high power voltage.

DESCRIPTION OF THE PREFERRED EMBODIMENTS

Figure 1:
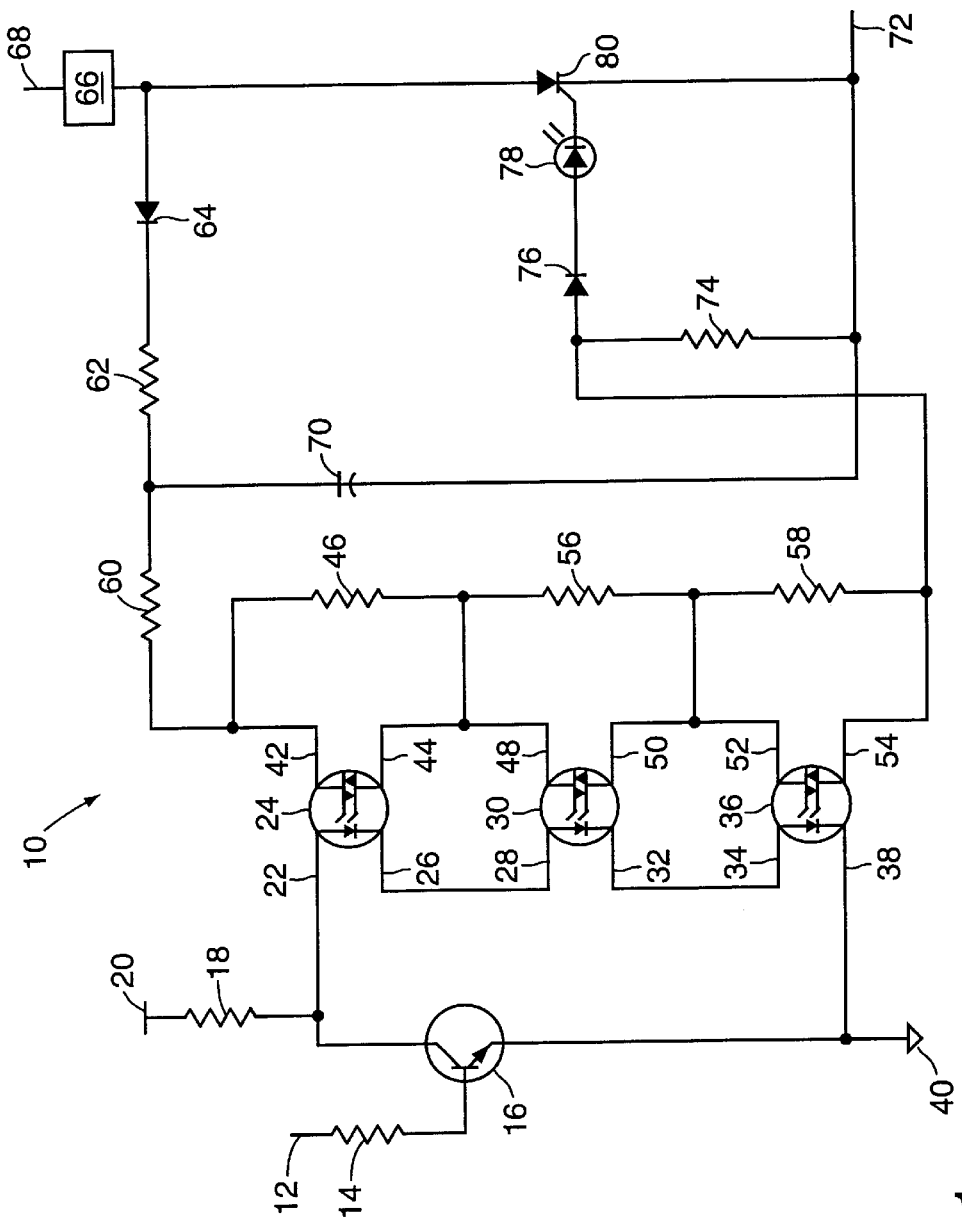
FIG. 1 is an electrical circuit diagram of a single SCR gate circuit of the present invention.

Referring to FIG. 1, there is shown an electrical circuit diagram of a single SCR gate circuit 10 of the present invention. A microcontroller, not shown, provides a signal 12 for firing an SCR via circuitry to be described. The microcontroller signal 12 may be provided to a 2.2K Ohm resistor 14 which is, in turn, provided to the base of transistor 16. The transistor 16 may, for example, be a MPS4124 transistor manufactured by Motorola.

The collector of transistor 16 may be connected to a 220 Ohm resistor 18 which is, in turn, connected to a 5 Volt power supply 20. The collector of transistor 16 may also be provided to a first input 22 of an opto-coupler circuit 24. A second input 26 of the opto-coupler circuit 24 is connected to a first input 28 of a second opto-coupler circuit 30. A second input 32 of opto-coupler circuit 30 is connected to a first input 34 of a third opto-coupler circuit 36. The second input 38 of the third opto-coupler circuit 36 may be connected to the emitter of transistor 16 as well as to a 5 Volt ground 40. The opto-coupler circuits 24, 30, 36 may be MOC3052 opto-coupler circuits manufactured by Motorola.

Disposed between the outputs 42, 44 of the first opto-coupler circuit 24 is a resistor 46 which may be a 1M Ohm resistor. Similarly, disposed between outputs 48, 50 of the second opto-coupler circuit 30 and outputs 52, 54 of the third opto-coupler circuit 36 may be 1M Ohm resistors 56 and 58, respectively. In addition, as shown, resistor 46 is connected to resistor 56 which is, in turn, connected to resistor 58.

Output 42 of the first opto-coupler circuit 24 may also be connected to resistor 60 which may be a 15 Ohm resistor. Resistor 60 may be, in turn, connected to another resistor 62 which may be a 3K Ohm resistor. Resistor 62 may, in turn, be connected to the output of a diode 64. The diode 64 may be a 1N4007 diode manufactured by Motorola. The input of the diode 64 is connected to the output of a load 66. The load 66 may be equipment such as a variable frequency feeder. A first line 68 is provided to load 66 in order to connect to an AC power supply.

Resistor 60 may also be connected to a capacitor 70 which may be a 0.1 μF capacitor. Capacitor 70 may also be connected to a second line 72 as well as to a resistor 74. Resistor 74 may, for example, be a 1.2K Ohm resistor. The opposing end of resistor 74 may be connected to the second output 54 of the third opto-coupler circuit 36 as well as to the input of diode 76. Diode 76 may be a 1N4007 diode. The output of diode 76 may be provided to LED 78 which is, in turn, provided to the gate terminal of SCR 80. The input of SCR 80 is provided from load 66 and the output is provided to line 72.

In operation, the signal 12 from the microcontroller may be a low voltage digital signal. Specifically, digital logic may be used to turn the opto-couplers on or off in order to fire the SCR 80 as required. Alternatively, analog logic may be used to turn the opto-couplers on or off in order to fire the SCR 80 as is standardly done in the industry. As shown, three opto-couplers 24, 30, and 36 help isolate the low control voltage of signal 12 from the load 66 which, for example, may be as high as 380 to 600 Volts. As a result, the signal 12 may, in turn, be provided for activating the SCR 80 while protecting the microcontroller and other related circuitry from the high voltage load 66.

The charge in the capacitor 70 is used to gate the SCR 80. Specifically, when the opto-couplers 24, 30, and 36 are turned on, energy stored in capacitor 70 is dissipated into the gate of the SCR 80 via the opto-couplers. As a result, opto-couplers 24, 30, and 36 serve as solid sate switches. When the opto-couplers are on, the circuitry allows the capacitor 70 to gate the SCR 80. Conversely, when the opto-couplers are off, the SCR 80 is not triggered.

The diode 64 is used to maintain a full charge on the capacitor 70 even when the line voltage 68, 72 is zero in order to allow the SCR 80 to be gated at no or low voltages. However, for the embodiment shown in FIG. 1, the SCR 80 can only be fired when the line voltage 68 is positive. That is, in applications where the load is fired when the AC line voltage is only positive, the SCR firing circuit 10 may be employed.

Because the diode 64 is connected to the anode of the SCR 80, the capacitor 70 charges with the correct polarity during the time interval when the SCR 80 is not conducting. That is, the capacitor 70 charges when the line voltage 68 is positive and the SCR 80 is not being fired. The charge on the capacitor 70 is connected to the gate of the SCR 80 through an opto-coupled solid state switch (i.e., the triac located within each of the opto-couplers 24, 30, 36). Diode 64 also helps allow the capacitor 70 to maintain its high level of charge when the line 68 voltage is low.

Resistors 60 and 62 are sized to limit the current provided to the gate of the SCR 80 when the AC line voltage is at its peak level so as not to exceed the maximum current rating of the opto-couplers 24, 30, and 36. When the AC line voltage is at a low level, the resistors 60 and 62 limit the current to a level not sufficient to gate the SCR 80. The charge in capacitor 70 has a leveling effect on the AC line voltage which may provide a more constant voltage level for triggering the SCR 80. That is, when the AC line 68 reaches its peak voltage, the capacitor 70 is charged to a high level corresponding to the AC line peak voltage. The capacitor 70 roughly maintains that high voltage until the triggering of the SCR 80 occurs. When the SCR 80 is triggered, the charge in the capacitor 70 dissipates and is recharged when the AC line 68 voltage goes positive. Further, the capacitor 70 charges to its high level when the line voltage reaches its peak value.

Since the capacitor 70 is charged during the off time of the SCR 80, sufficient energy is stored to provide a stable and reliable firing pulse at or slightly leading the zero cross of the desired conducting wave form. This helps ensure the maximum obtainable output voltage across a broad range of ambient operating temperatures encountered in industrial environments (for example, from 120° to −40° F.). Further, the RC network formed by capacitor 70 and resistor 62 is used to snub or suppress the transient voltages across the SCR 80.

Another advantage of diode 64 is that it removes the AC from capacitor 70. This provides protection for the capacitor 70 and may allow for the use of a lower voltage capacitor since the AC voltage ratings of the capacitor are much lower than its DC voltage ratings. Resistor 74 holds the gate voltage low when not fired and helps prevent self firing. Resistor 74 allows that current to pass back into the line 72 rather than the gate of the SCR 80. The lower the gate potential, the less likely the SCR 80 could be fired by line noise.

Several of the opto-coupler circuits 24, 30, and 36 are connected in series using a suitable resistance network (i.e., resistors 46, 56, and 58) to balance the voltage drop across each device to obtain blocking voltage ratings sufficient to withstand the peak of the applied line voltage plus a suitable safety factor. That is, the balancing resistors 46, 56, and 58 allow a small amount of current to pass by the opto-couplers 24, 30, and 36 when the opto-couplers are off. Although three opto-coupler circuits have been shown in series, only one opto-coupler circuit could be used. Further, more than three opto-coupler circuits may be used to isolate higher line voltages.

The diode 76 blocks reverse voltage and current in the gate circuitry (the gate circuitry comprises all items shown in FIG. 1 except the load 66, SCR 80, and lines 68 and 72). The diode 76 blocks reverse current flow which should not occur unless SCR failure occurs. In such an event, the gate circuitry would be protected. LED 78 merely indicates that the gate current or pulse is present and is not required for circuit operation.

Figure 2:
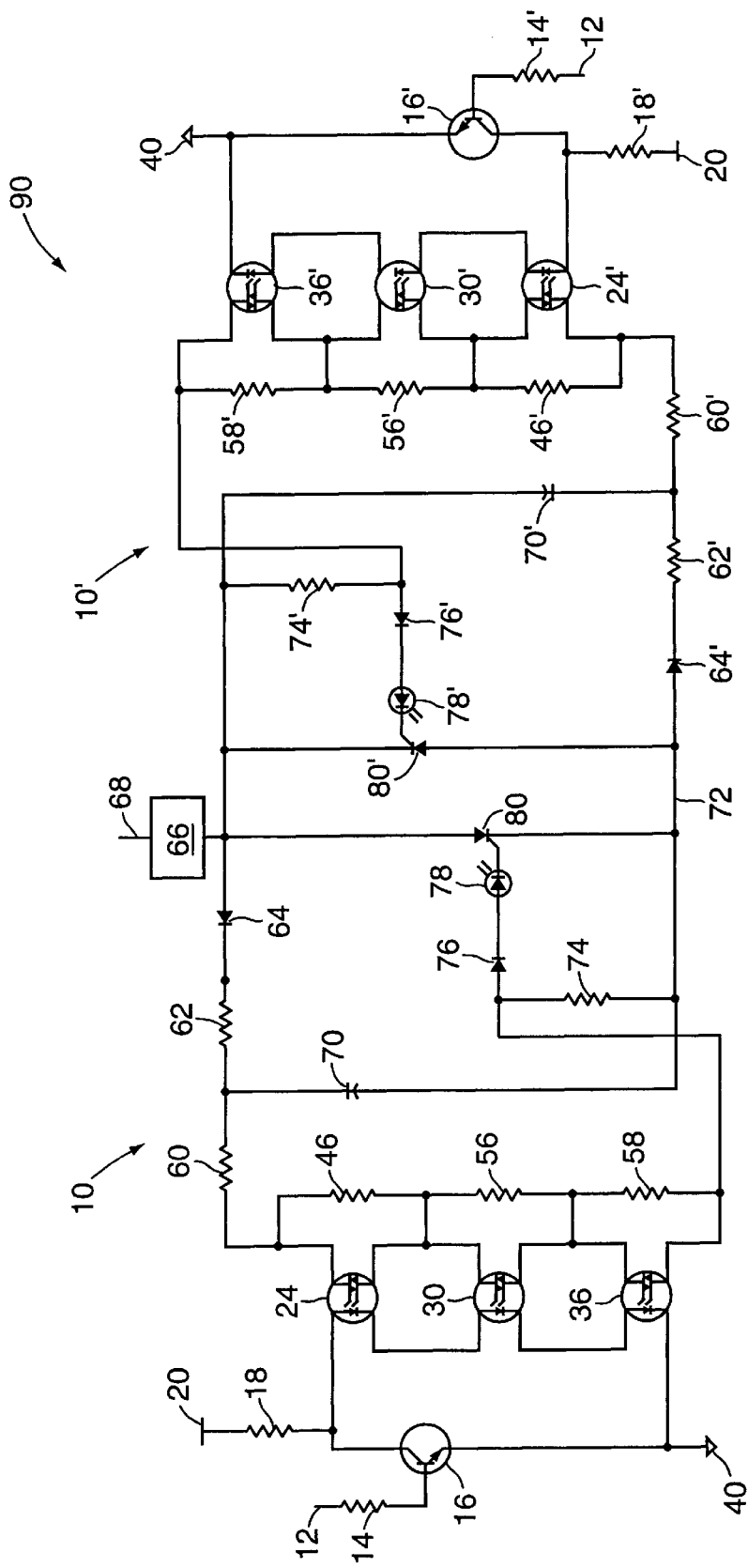
FIG. 2 is an electrical circuit diagram of a back to back SCR gate circuit of the present invention.

Now referring to FIG. 2, there is shown an alternate embodiment of the present invention wherein two SCR gate circuits 10, 10' are utilized to form a back to back SCR gate circuit 90. For purposes of clarity, similar components have been labeled similarly and numerals having a prime designation reflect the second SCR gate circuit. It should be further noted that the signal 12 from the microcontroller, the 5 Volt supply 20, the 5 Volt ground 40, lines 68 and 72 as well as the load 66 are common for both circuits.

The back to back SCR firing circuit 90 comprises a first diode 64 and a second diode 64', a first capacitor 70 and a second capacitor 70', and an SCR 80. The first diode 64 charges the first capacitor 70 for firing the SCR 80 when the line 68 voltage is positive and the second diode 64' charges the second capacitor 70' for firing the SCR 80' when the line voltage is negative. Further, the first capacitor 70 is charged when the line voltage is positive and remains charged until the SCR 80 is fired during a positive cycle of the line 68 voltage and the second capacitor 70' is charged when the line voltage is negative and remains charged until the SCR 80' is fired during a negative cycle of the line 68 voltage.

The back to back SCR firing circuit 90 may further comprise a first isolating circuit for isolating the control signal 12 used for triggering the load when the line 68 voltage is positive and a second isolating circuit for isolating the control signal 12 used for triggering the load when the line voltage is negative. The first isolating circuit comprises at least one opto-coupler circuit 24 but preferably comprises three opto-coupler circuits 24, 30, and 36. Similarly, the second isolating circuit comprises at least one opto-coupler circuit 24' but preferably comprises three opto-coupler circuits 24', 30', and 36'.

The back to back SCR gate circuit 90 allows for conducting the negative and positive halves of the AC line 68, 72. That is, the back to back SCR gate circuit 90 may be used where it is necessary to select half waves of opposite polarity. As a result, in applications where the load is fired when the AC line voltage is both positive and negative, the back to back SCR gate circuit 90 may be employed. In other words, where the frequency powering the load 66 is an odd submultiple of the line frequency (i.e., the AC line 68 frequency multiplied by two divided by an odd number is needed to power the load 66), then the back to back SCR gate circuit 90 may be employed. Where, however, the frequency powering the load 66 is an even submultiple of the line frequency (i.e., the AC line 68 frequency multiplied by two divided by an even number is needed to power the load 66), the SCR firing circuit 10 illustrated in FIG. 1 may be employed.

Figure 3:
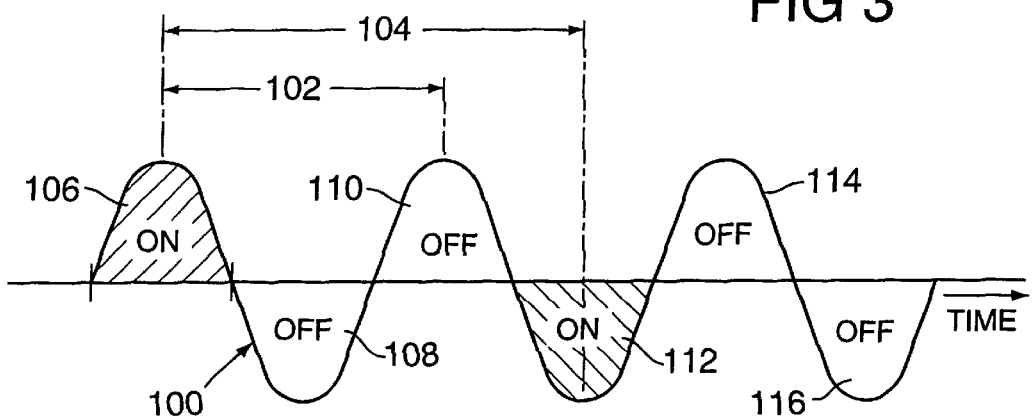
FIG. 3 in illustration of a voltage waveform and the submultiple operation for activating the load.

FIGS. 3 and 4 illustrate an example where a back to back SCR gate circuit may be employed. Referring specifically to FIG. 3, a 60 Hz voltage waveform 100 is shown having a period of 0.01666 seconds as shown by 102. Where a piece of equipment operates at 40 Hz, the period of the waveform would be 0.025 seconds as shown by 104. The frequency powering the load 66 would be an odd submultiple of the line frequency because the 60 Hz waveform 100 multiplied by two (for both the positive and negative phases of the waveform) and divided by three (the odd submultiple) results in a 40 Hz frequency for powering the load. As a result, the equipment would be fired during a given positive half cycle 106 of the voltage waveform 100 and would not be fired during the subsequent two half cycles 108, 110 of the voltage waveform 100. Then, the equipment would be once again fired during the negative half cycle 112 and would not be fired for the subsequent two half cycles 114, 116 of the voltage waveform 100.

Figure 4A:
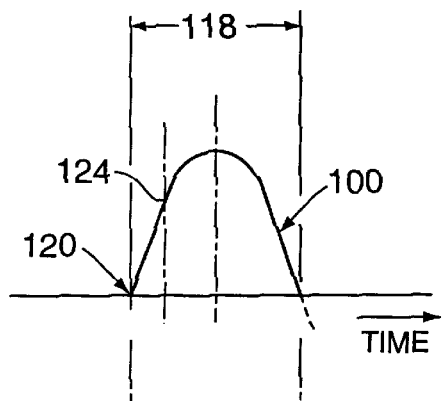
FIG. 4A is an illustration of the positive cycle of the voltage waveform.
Figure 4B:
FIG. 4B is an illustration of the gate pulse from the microcontroller.
Figure 4C:
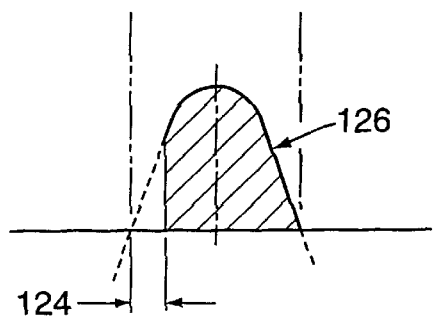
FIG. 4C is a waveform illustrating the voltage across the load.

It is desirable to turn on the equipment as close as possible to the zero cross point of the voltage waveform 100 to better power the equipment. Referring also to FIG. 4A, there is shown a half cycle 118 of the voltage waveform 100 as well as the zero cross point 120. Moreover, in FIG. 4B, the signal 12 from the microcontroller which is shown as a gate pulse 122 is provided to turn the equipment on at time 124. The SCR firing circuit 10 helps minimize the delay 124 from the zero cross point 120 to the firing point of the SCR 80. As a result, the circuit helps to maximize the available output to power the equipment or load 66. Therefore, as shown in FIG. 4C, the voltage across the load may be maximized because the delay in firing the SCR circuit is minimized.

The SCR firing circuit 10 is capable of having a relatively short delay 124 due to the fact that during the off time of the feeder, the capacitor 70 is charged even when the line 68 voltage is low. When the gate pulse 122 is provided, the capacitor 70 can quickly be discharged into the SCR 80 gate. Moreover, the capacitor 70 also serves as a transient suppresser across the SCR 80, protecting the SCR from voltage spikes that may occur when switching highly inductive loads.

The SCR firing circuit 10 may be used for high voltage control of vibratory or electromagnetic feeders operating at frequencies that are submultiples of the power line frequencies (i.e., 60 Hz or 50 Hz). A variable frequency feeder may, for example, run at 40 Hz. When using a 60 Hz line, the back to back circuitry 90 may be employed for powering the load 66.

The low cost SCR firing circuit disclosed is useful in industrial control applications operating from high voltage power line sources such as 380 to 600 Volts at a frequency of 50 or 60 Hz. Not only would the invention be useful for activating vibratory or electromagnetic feeders, it would also be useful for other high voltage applications that used skipped wave forms or other firing of SCR's in general high voltage uses. It should be recognized that, while the present invention has been described in relation to the preferred embodiments thereof, those skilled in the art may develop a wide variation of structural details without departing from the principles of the invention. Therefore, the appended claims are to be construed to cover all equivalents falling within the true scope and spirit of the invention.

What is claimed is:

1. An SCR firing circuit, the SCR firing circuit for coupling to a control signal, the SCR firing circuit further for coupling to a load and to an AC power source, the AC power source having an AC line voltage, the SCR firing circuit comprising:

an opto-coupler for coupling to the control signal, the opto-coupler conductive in response to the control signal, and wherein the opto-coupler isolates the control signal from the AC line voltage;

a diode for coupling to the load and the AC power source;

a capacitor coupled to the diode and to the opto-coupler, wherein the capacitor is chargable from the AC power source through the diode during a half-cycle of the AC line voltage; and an SCR coupled through a gate of the SCR to the opto-coupler, the SCR further coupled through an input of the SCR to the load, and wherein when the capacitor is charged, in response to the control signal the capacitor is discharged through the opto-coupler to fire the SCR and provide AC power to the load.

2. The firing circuit of claim 1 wherein the opto-coupler isolates a control signal generated by a microcontroller for providing AC power to a vibratory feeder.

3. The firing circuit of claim 1 wherein the opto-coupler isolates a control signal generated by an analog circuit for providing AC power to a vibratory feeder.

4. The firing circuit of claim 1 further comprising three opto-couplers disposed in series for coupling to the control signal.

5. A back to back SCR firing circuit, the back to back SCR firing circuit for coupling to a control signal, the back to back SCR firing circuit further for coupling to a load and to an AC power source, the AC power source having an AC line voltage, the back to back SCR firing circuit comprising:

a first opto-coupler for coupling to the control signal, the first opto-coupler conductive in response to the control signal;

a first diode for coupling to the load and to the AC power source;

a first capacitor coupled to the first diode and to the first opto-coupler, wherein the first capacitor is chargeable from the AC power source through the first diode;

a first SCR coupled through a gate of the first SCR to the first opto-coupler, the first SCR further coupled through an input of the first SCR to the load, wherein when the first capacitor is charged, in response to the control signal the first capacitor is discharged through the first opto-coupler to fire the first SCR and provide AC power to the load during a positive half cycle of the AC line voltage;

a second opto-coupler for coupling to the control signal, the second opto-coupler conductive in response to the control signal;

a second diode for coupling to the load and to the AC power source;

a second capacitor coupled to the second diode and to the second opto-coupler, wherein the second capacitor is chargeable from the AC power source through the second diode; and a second SCR coupled through a gate of the second SCR to the second opto-coupler, the second SCR further coupled through an input of the second SCR to the load, wherein when the second capacitor is charged, in response to the control signal the second capacitor is discharged through the second opto-coupler to fire the second SCR and provide AC power to the load during a negative half cycle of the AC line voltage.

6. The back to back firing circuit of claim 5 wherein the first opto-coupler isolates the control signal from the AC line voltage during the positive half cycle of the AC line voltage and the second opto-coupler isolates the control signal from the AC line voltage during the negative half cycle of the AC line voltage.

7. The back to back firing circuit of claim 5 wherein the first capacitor is charged during a postive half cycle of the AC line voltage, and when the first capacitor has been charged, the first capacitor remains charged until the SCR is fired during a positive half cycle of the AC line voltage; and wherein the second capacitor is charged during a negative half cycle of the AC line voltage, and when the second capacitor has been charged, the second capacitor remains charged until the SCR is fired during a negative half cycle of the AC line voltage.

8. The back to back SCR firing circuit of claim 5 wherein AC power to the load is provided at a selected frequency independent of an AC power source frequency.

9. The back to back SCR firing circuit of claim 5 wherein the first SCR is fired within a quarter cycle following a positive-going zero crossing of the AC line voltage and wherein the second SCR is fired with the quarter cycle following a negative-going zero crossing of the AC line voltage.

10. The back to back SCR firing circuit of claim 5 wherein the AC power to the load is provided in three phases.

* * * * *